(12) United States Patent
Schneider (10) Patent No.: US 7,773,000 B1
(45) Date of Patent: Aug. 10, 2010

(54) EFFICIENT CODING OF INTEGERS IN NON-POWER-OF-TWO RANGES

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 45 days.

(21) Appl. No.: 12/394,634

(22) Filed: Feb. 27, 2009

(51) Int. Cl.
*H03M 5/00* (2006.01)

(52) U.S. Cl. ............... 341/56; 341/51; 341/55; 341/50

(58) Field of Classification Search .......... 341/50, 341/51, 56, 60
See application file for complete search history.

(56) References Cited

U.S. PATENT DOCUMENTS

| | | | |
|---|---|---|---|
| 5,771,244 A | 6/1998 | Reed et al. | |
| 6,490,357 B1 | 12/2002 | Rose | |
| 6,798,362 B2 * | 9/2004 | Modha | 341/51 |
| 6,898,756 B1 | 5/2005 | Fekri et al. | |
| 7,280,055 B2 * | 10/2007 | Drasny | 341/63 |
| 2004/0085228 A1 * | 5/2004 | Modha | 341/50 |
| 2006/0072743 A1 | 4/2006 | Naslund et al. | |
| 2007/0150794 A1 | 6/2007 | Naslund et al. | |
| 2009/0174582 A1 * | 7/2009 | Murashima | 341/55 |

OTHER PUBLICATIONS

Rushanan: A Tutorial on Finite Fields and Binary m-Sequences The Mitre Corporation, Dec. 1996, 88 pages.

* cited by examiner

*Primary Examiner*—Jean B Jeanglaude
(74) *Attorney, Agent, or Firm*—Blakely, Sokoloff, Taylor & Zafman LLP (57) ABSTRACT

Coding efficiently in non-power-of-two ranges. Coding is performed in an N-bit system, where certain codes are represented with N bits and other codes are represented with (N+1) bits. An example is where the other codes may have an N-bit representation used to represent multiple values, with the additional bit being disambiguation information provided to distinguish the codes having multiple values. Thus, N bits are used to represent most codes, and an extra bit is used to represent other codes. The number of bits per element used for representing a sequence is, on average, close to a theoretical minimum for N-bits.

20 Claims, 5 Drawing Sheets

EFFICIENT CODING OF INTEGERS IN NON-POWER-OF-TWO RANGES

FIELD

The invention is generally related to implementation of coding, and particular embodiments relate to overlapping codes for particular values and providing disambiguation for the reused code for coding in finite fields.

COPYRIGHT NOTICE/PERMISSION

At least a portion of the disclosure of this patent document contains material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2008, Red Hat, Inc., All Rights Reserved.

BACKGROUND

The coding of integers finds application in many fields of computing systems. Integer coding occurs, for example, in finite field arithmetic. Finite field arithmetic has many uses in computing systems. Finite field arithmetic refers to computations based on a finite field of elements, commonly used for factoring polynomials. Galois Field mathematics is finite field mathematics, and a Galois Field has a finite number of elements, where any power of any element of the field is also an element of the field. An example of the use of finite field mathematics is in the area of cryptography, where data is encrypted for security. The coding and decoding of the data may be based on finite field mathematics, where the codes are determined from the field. Cryptography systems may use a base $2^N$ (such as the familiar AES (Advanced Encryption Standard) algorithm) or non-$2^N$ base, where the use of non-$2^N$ bases is becoming more common.

Additionally, the storage and transmission of digital data is ubiquitous in computing systems. Receiving a transmission or retrieving stored information may reveal an error in the data, which may be caused by the storage, the transmission, and or the reading. Error correction techniques may be employed to obtain the desired data even in the presence of errors. A common error correction technique includes the use of parity bits or error codes that can help reconstruct data that has errors. Among error correction techniques are techniques implemented in accordance with or based on familiar Reed-Solomon coding.

The implementation of Reed-Solomon coders is based on the application of Galois Field mathematics. Briefly, code symbols in the Reed-Solomon coders are defined in a Galois Field of numbers represented as GF(Q), where Q is a positive integer. Relatively recent advances showed the benefits of using prime numbers as the base for the Galois Fields, rather than a $2^N$ base. Common Reed-Solomon implementations use GF(257) and GF(65,537), which are prime numbers that are also $2^8+1$ and $2^{16}+1$, respectively. These prime bases also have application in the use of cryptography systems. These prime bases have the property of being a single number higher than what can be represented by an 8-bit or a 16-bit representation, respectively, where 8- and 16-bits are useful for binary computing systems.

However, where the base field is GF(257) or GF(65,537), certain codes cannot be represented reliably using 8 or 16 bits, since there is one more element than either representation can hold. The extension of that problem is also seen in other fields having a non-$2^N$ base. Typically, this problem is resolved by either ignoring the problem (which generally cannot be done for values other than 257 or 65,537), using a complex conversion process, which requires additional logic and processing, or using the additional bit to represent the codes, which increases data use in the storage and/or transmission bandwidth. Thus, these known resolutions are typically limited to the use of primes of the form $2^N+1$, because other primes exacerbate the problem. The primary issue is that for values not of the form $2^N$ (with the problem ignored) or $2^N+1$ is that more bits than necessary are used for the codes. Consider a base 53. GF(53) includes the values 0-52, which would likely be represented with 6-bit encoding, because any value 0-63 could be represented with 6 bits. Thus, current coding schemes are often inefficient.

BRIEF DESCRIPTION OF THE DRAWINGS

The following description includes discussion of figures having illustrations given by way of example of implementations of embodiments of the invention. The drawings should be understood by way of example, and not by way of limitation.

DETAILED DESCRIPTION

As described herein, coding efficiently for integers in ranges other than a power-of-two is performed. The efficient coding is based on binary coding of values in a range other than one spanned by a power of two, which includes coding with finite fields. Consider a system configured to code in a base of P, where P is a prime number greater than M, where M is a power-of-two number $2^N$, N being a positive integer. For coding in base P, each element of a sequence to code has a numeric integer value within the range 0 through (P−1). The coding of the elements is performed with either N or (N+1) bits, depending on a range in which the numeric value of the element lies. For all elements in the sequence having a value within the range of integers (P−M) through (M−1), the element is coded to an N-bit representation. For all elements in the sequence having a value within the ranges of integers 0 through (P−M−1) or M through (P−1), the element is coded to an (N+1)-bit representation. The system generates a coded sequence with the representations.

The following examples are illustrative. As suggested above, the use of prime bases is common for cryptographic system implementation, as well as for Reed-Solomon error correction coding. Examples of the use of prime bases may include the following. For a GF(257) coding implementation, P=257, where N=8 and M=256. Thus, elements of a sequence to be coded are coded with an 8-bit representation for all values in the range of 1-255. The values 0 and 256 are coded with an additional bit (9 bits total) to distinguish them. For a GF(271) implementation, P=271, where N=8 and M=256. Elements of the sequence to be coded are represented in 8 bits for all elements having values in the range 15-255. The elements having values within the ranges 0-14 or 256-270 are coded with an additional bit (9 bits). In one embodiment, 8 bits of the 9-bit representation are the 8-bit representation of the codes modulo N (or modulo 256 in the case of 8 bits). The sequence then has certain codes that represent two different values (e.g., 0 and 256, 1 and 257, 2 and 258, etc.). Thus, certain codes may be used to represent multiple values (0 and 256 in the first example, 0-14 and 256-270 in the second example). The additional bit is then disambiguation information provided to distinguish the codes having multiple values. Thus, N bits are used to represent most codes, and an extra bit (N+1 bits) is used to represent the other codes. The number of bits per element used for representing a sequence is, on average, very close to the theoretical minimum of N-bits.

A similar example to the P=271 case is an example of a non-prime base. For GF(289) (==GF($17^2$), P=289, and N=8 and M=256. Thus, elements within the range 33-255 would be coded with 8 bits, and elements having values within the ranges 0-32 or 256-288 are coded with an additional bit (9 bits). Again, 8 bits of the 9-bit representation can be the 8-bit representation of the codes modulo N (or modulo 256). The sequence then has certain codes that represent two different values (e.g., 0-32 and their corresponding values 256-288). Thus, certain codes may be used to represent multiple values (0 and 256 in the first example, 0-14 and 256-270 in the second example). A disambiguation bit is included to distinguish the representations representing multiple values.

Another example illustrates the use of a range that is not prime, and that does not represent a finite field. If P=18, the range of values is 0-17, and N can be set to 4 (N=4 corresponds to $2^4$=16). Thus, elements having values within the range 2-15 would be coded with 4 bits, and elements having values within the ranges 0-1 and 16-17 would be coded with an additional disambiguation bit for a total of 5 bits per code.

Thus, the problem of ignoring the additional codes or using a conversion process can be overcome by representing the codes as described above. Additionally, many values other than 2N+1 can be used, seeing there is an efficient way to deal with the additional values. The use of P=257 or P=65537 are common for 8 or 16 bit coding. The use of these values is convenient because they can be accomplished with a native format of the computing hardware logic for most codes, because 8 and 16 bit computing logic is common.

As suggested above, the value of P may commonly be selected to be a prime number (such as 257 and 65,537, the practical values of known primes equal to ($2^N$)+1–3, 5, 17, 257, and 65,537), but such a selection is not necessary. However, the use of P=257 or 65537 would integrate well with known cryptographic system implementations or Reed-Solomon error correction coding systems.

Thus, the techniques described herein can be applied to cryptographic systems (which may use finite fields or rings), general data compression (which is not necessarily related to any specific underlying mathematical construct or object), representing enumerated sets (which also is not necessarily related to any specific underlying mathematical construct), and error correction techniques (which uses finite fields) based on Reed-Solomon coding. Such error correction is common in multimedia storage and/or transmission, such as encryption and decryption used in compact discs (CDs) and digital versatile discs (DVDs, also commonly referred to as digital video discs). The use of the N and (N+1) bits in generating a coding sequence may be used in combination with many types of cryptographic systems, and other derivatives of Reed-Solomon coding.

Assuming a uniform distribution of the coded values, the coding described herein requires an average number of bits very close to a theoretical minimum near N bits to represent a value. For example, in the case where base 257 is used, the minimal entropy theoretical average for coding GF (257) is 8.00562 bits per coded value (assuming uniform distribution of the code values). Using 9 bits is 12.491% larger than this theoretical average (and the coding as outlined uses an average of 8.00778 bits per coded value, assuming uniform distribution of the code values, which is approximately 0.00216 bits (or 0.027%) per code more than the theoretical average.

Figure 1:
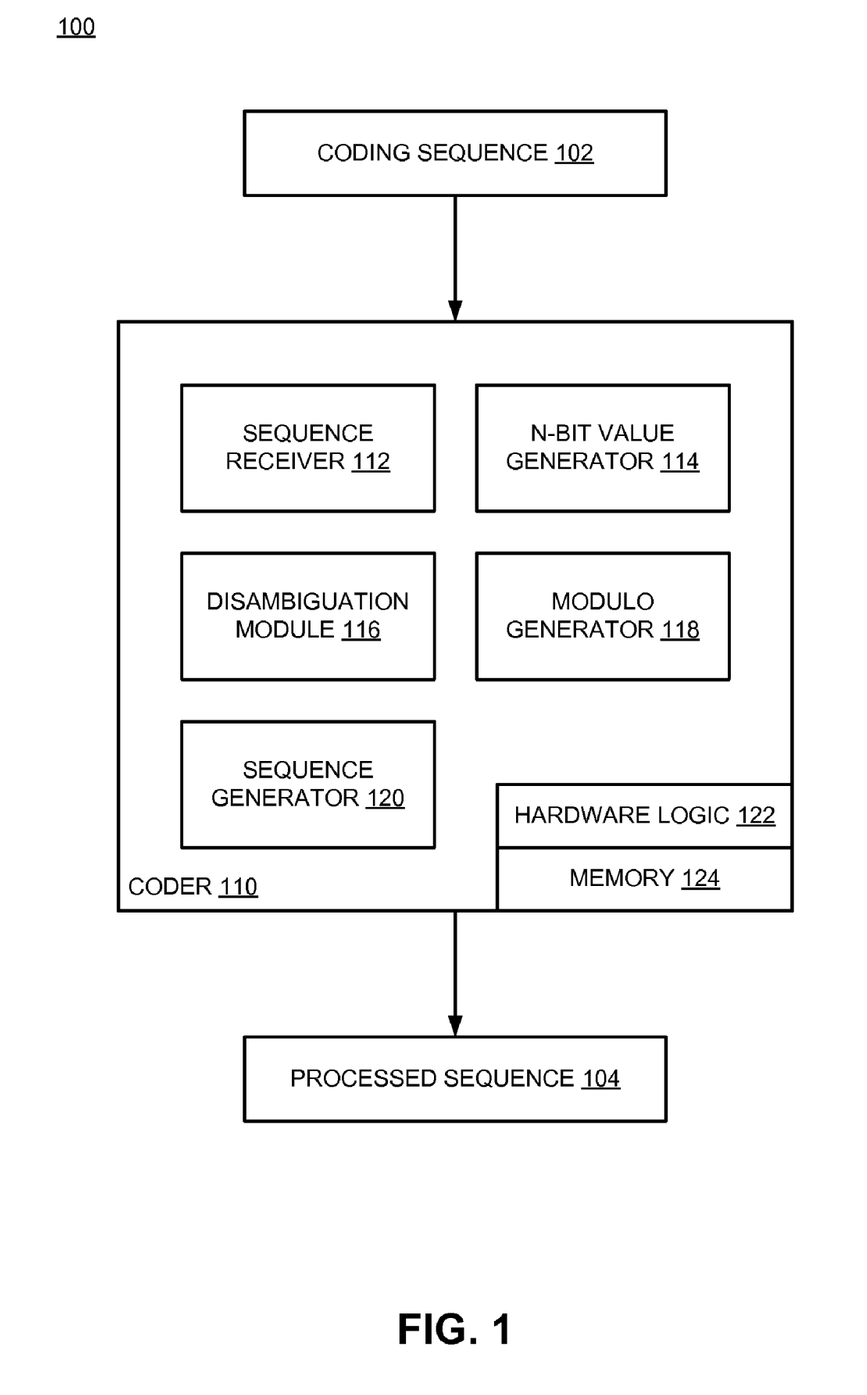
FIG. 1 is a block diagram of an embodiment of a system having a coder to efficiently code integers.

FIG. 1 is a block diagram of an embodiment of a system having a coder to efficiently code integers. System 100 represents a system, such as a personal computer, gaming system, storage device, or other computing system that implements coding in a finite field. System 100 receives coding sequence 102. Coding may refer generally to the encoding sequence, or the decoding of a coded sequence. In the case of encoding, sequence 102 is a sequence of elements to be encoded. In the case of decoding, sequence 102 is a sequence of coded elements to be decoded.

Coder 110 generates a coded sequence as described herein. In one embodiment, coder 110 is a decoder that is configured for either decoding operations or encoding operations. Coder 110 is implemented with hardware logic 122, such as a coding processor. Hardware logic 122 may include one or more processors, application specific integrated circuits (ASICs), programmable logic devices (PLDs), microcontrollers, or other hardware logic. For example, in a personal computer, a CPU or equivalent processing system executes operations in accordance with code in the computer. When the CPU executes the operations to implement coder 110, the CPU is the hardware logic or coding processor. Coder 110 typically also includes memory 124, such as registers, some form of random access memory (RAM), and/or flash in which code, results, sequence values, lookup tables, etc., are stored and used by hardware logic 122 for the implementation of coding.

Coder 110 is illustrated with various functional components, which may be separate components, or may be combined together. Thus, the illustration should be understood as one example only, and is not limiting. Coder 110 could be implemented with more or fewer components than what is shown in FIG. 1. Coder 110 includes sequence receiver 112, N-bit value generator 114, disambiguation module 116, modulo generator 118, and sequence generator 120.

Sequence receiver 112 enables coder 110 to receive a sequence of elements to be coded. Sequence receiver 112 can be generically considered a data interface, and may be considered to be part of coder 110, or a separate component that interfaces coder 110 to a source of coding sequence 102. The source may be a hardware component or a software component. Sequence receiver 112 may include an application programming interface (API) accessible to other hardware and/or software components of system 100. Thus, coder 110 may be invoked from external to coder 110, and either passed sequence 102, or passed a reference to a memory location in which sequence 102 is stored and can be accessed. Sequence receiver 112 may also include a network interface to receive information transmitted over a network or from another device, and/or a storage interface to receive information from a storage device for coding.

N-bit value generator 114 enables coder 110 to generate an N-bit representation for elements of sequence 102. As suggested above, for all elements in sequence 102 having a value within the range of integers (P–M) through (M–1), the element is coded to an N-bit representation. N-bit value generator 114 may include a lookup table or an algorithmic converter that performs the operation to generate the N-bit representation. In one embodiment, the N-bit representation is a basis for the (N+1)-bit representation, such as an N-bit representation plus an additional disambiguation bit.

Disambiguation module 116 enables coder 110 to generate a unique or distinguishable representation for elements represented with (N+1) bits. As suggested above, for all elements in the sequence having a value within the ranges of integers 0 through (P−M−1) or M through (P−1), the element is coded to an (N+1)-bit representation. The (N+1)-bit representation could simply be an (N+1)-bit representation of the value. Alternatively, the representation may be an N-bit representation with a disambiguation bit. Disambiguation information could refer to either an (N+1)-bit representation of the value of the element, or the bit that distinguishes one N-bit representation from another.

In an implementation using a disambiguation bit, the bit can be placed in one of various locations within the stream. The use of a different location would be controlled by configuration. The configuration could be static, in that participating systems would always use the same formatting to identify element value bits and disambiguation bits. Alternatively, each sequence could include a preamble or header to indicate the type of formatting used, which could also identify the structure of the sequence including disambiguation bit location. For example, a disambiguation bit could be placed directly before or directly after the value it disambiguates. For instance, if 0 and 256 were both represented by 00000000b, the addition of the disambiguation bit could make the possible representations 100000000b or 000000000b, or 000000001b or 000000000b. In one embodiment, the additional zero could indicate '0', while the extra one could indicate '256'. However, the use of the disambiguation bit could be reversed.

As an alternative to adding a disambiguation bit directly before or after the code to disambiguate, multiple disambiguation bits could be collected and indicated jointly, for example, with a single value. For example, in an 8-bit implementation, an extra 8-bit byte per 8 elements to disambiguate of the sequence could be added. The extra byte could be added prior to the elements it disambiguates, or added after the elements. The extra byte occur less frequently than once every 8 elements, since it is only needed to disambiguate "ambiguous" elements. Thus, any number of elements that do not need disambiguation could be spread throughout the elements to disambiguate (in this example, 8). The disambiguation information can act as a map to indicate the value of the multi-use code. A more specific example is provided below with respect to FIG. 2B. Generally, for example, a pattern of '010' in a disambiguation value could indicate that the first ambiguous element encountered should be its face value, while the second element should be given its value plus N.

In a decoding scenario, sequence receiver 112 receive a coded sequence 102. Disambiguation module 116 determines where in the sequence the disambiguation information is found (e.g., a 9-bit representation of a value, which could be indicated by a bitmap, a disambiguation bit before or after, or a collection of disambiguation bits). Using the disambiguation information, the decoding can correctly interpret the value of each element in the sequence.

Modulo generator 118 enables coder 110 to perform a modulo operation in one embodiment of a disambiguation operation. For example, coding elements to an (N+1)-bit representation may include computing a mathematical result of the value modulo N. The result can then be represented by an N-bit representation with N-bit value generator 114, where the N-bit representation is the representation of the face-value of the result. The modulo may be configured to indicate whether the value was greater than N, in which case a disambiguation bit (either a zero or one) could indicate that N should be added to the result to generate the original value represented.

Sequence generator 120 enables coder 110 to generate encoded or decoded (collectively, "processed") elements, as illustrated by processed sequence 104. The encoded sequence is ready to store and/or transmit. The decoded sequence is ready to use to perform error correction or data decompression.

Figure 2A:
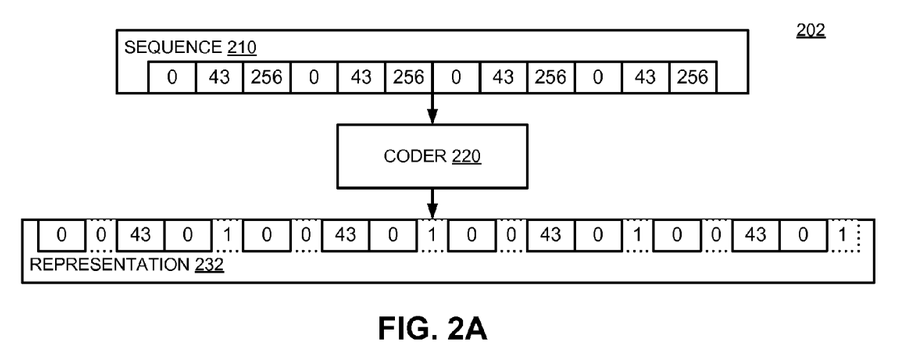
FIGS. 2A-2C provide example embodiments of coding results for a given input sequence.
Figure 2B:
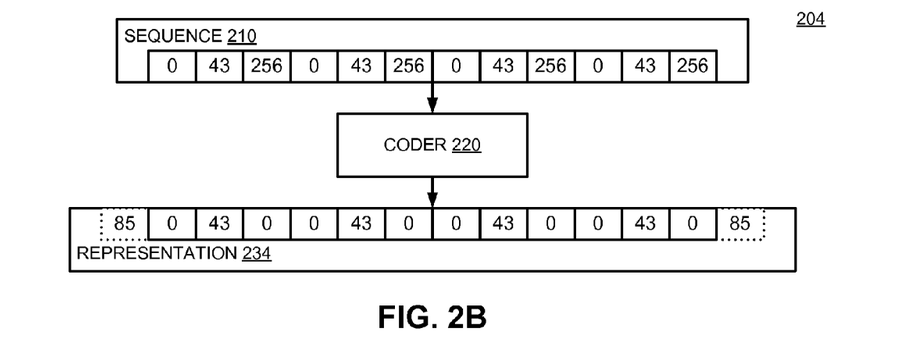
Figure 2C:
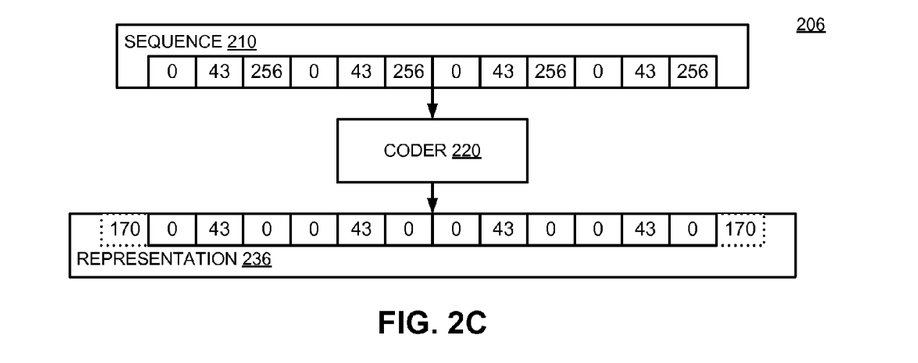

FIGS. 2A-2C provide example embodiments of coding results for a given input sequence. FIG. 2A illustrates series of operations 202, through which sequence 210 is processed to representation 232 by coder 220. FIG. 2B illustrates series of operations 204, through which sequence 210 is processed to representation 234 by coder 220. FIG. 2C illustrates series of operations 206, through which sequence 210 is processed to representation 236 by coder 220. For the examples, assume M=256 and P=257. The example sequence 210 for 202, 204, and 206 is a simple sequence of 0, 43, 256, 0, 43, 256, 0, 43, 256, 0, 43, 256. In FIG. 2A, coder 220 can encode the sequence as an 8-bit 0, a single 0 bit, an 8 bit 43, an 8 bit 0, a single 1 bit, and so forth, repeated to the end of sequence 210. In representation 232, the assumption is that the 8-bit 0 is understood as an "ambiguous" code value. For example, it may be indicated as ambiguous in a lookup table or subroutine that indicates a disambiguation bit is needed. Note also the assumption that a single disambiguation bit directly follows the value or element it disambiguates.

In FIG. 2B, coder 220 can encode the sequence as a sequence of 8-bit values: 0, 43, 0, 0, 43, 0, 0, 43, 0, 0, 43, 0, with a disambiguation value, 85 either directly before or after the 8 elements it disambiguates. It will be seen that the sequence actually contains 12 elements, but four of those 12 elements do not need to be disambiguated, so an 8-bit disambiguation value is only needed every 12 elements. The value 85 corresponds to 01010101b. Thus, the assumption is that the additional zero indicates the zero should be interpreted on its face, to a value of zero. The additional one indicates the zero should be interpreted as zero plus 256, or 256.

FIG. 2C illustrates a simple alternative to FIG. 2B. Namely, instead of providing an 8-bit disambiguation value of 85, or 01010101b, a 170 or 10101010b indicates the disambiguation bits. Thus, the assumption for representation 236 is that the additional one indicates zero should be interpreted on its face, while the additional zero indicates zero should be interpreted as 256.

As mentioned above, the simple representations shown could easily be extended to a code of 0 through (P−1), where P is a value other than a power of two. Thus, if M is the greatest power-of-two number less than P, the values in the range (P−M) through (M−1), inclusive, could be represented as usual, and the values 0 through (P−M−1) and M through (P−1) could be represented as the same bit sequence, with an additional disambiguation bit.

Figure 3:
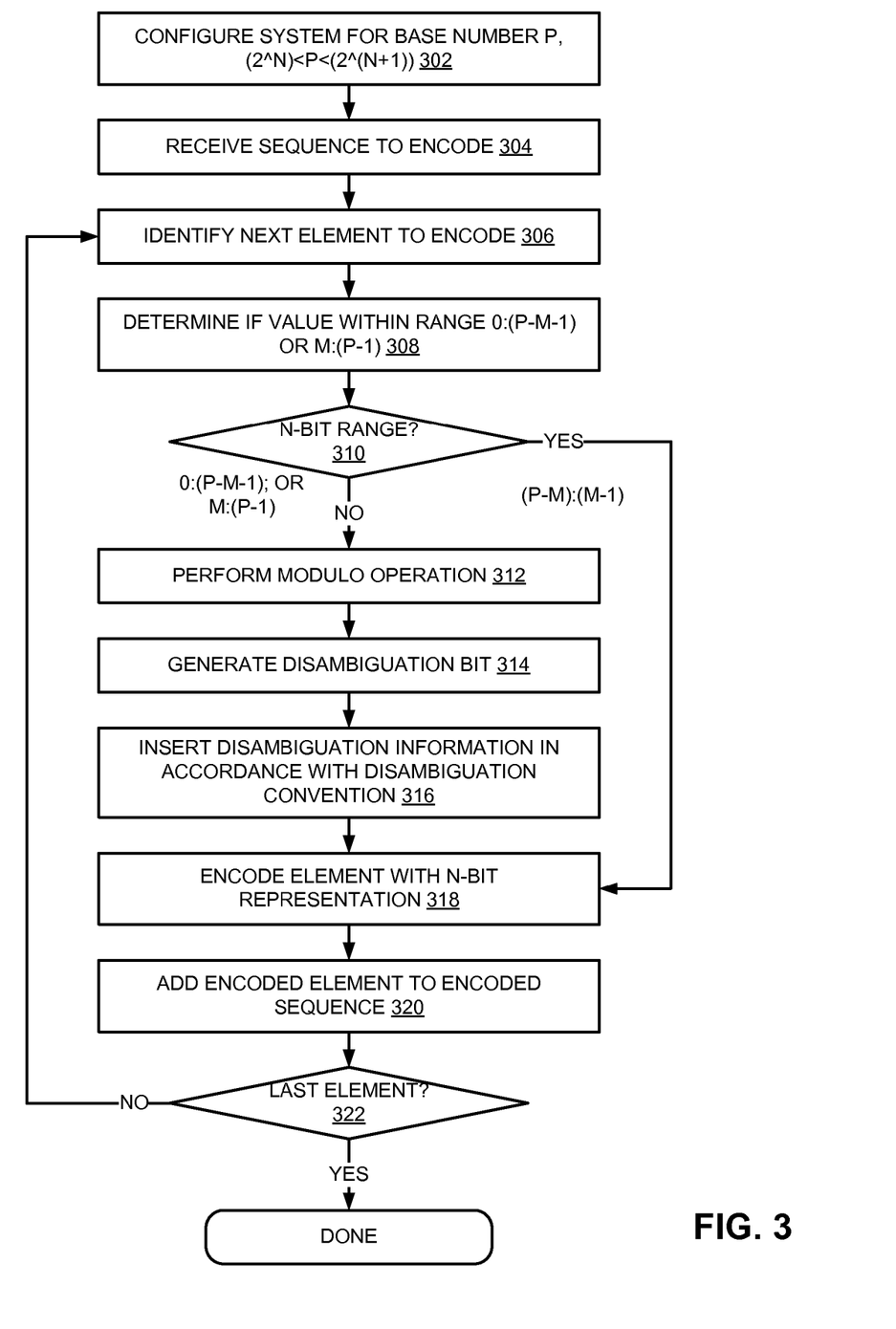
FIG. 3 is a flow diagram of an embodiment of a method for efficiently encoding integers.

FIG. 3 is a flow diagram of an embodiment of a method for efficiently encoding integers. The method or process may be performed by processing logic that may include hardware (e.g., circuitry, programmable logic, microcode, etc.), software (such as instructions run on a processing device), or a combination thereof. For convenience, reference is made to components that might perform one or more of the operations described below. Reference to particular components may not necessarily be exclusive, and other components not specifically called out may perform one or more of the following operations.

A system (e.g., system 100 of FIG. 1) is configured for a base of P, which is greater than a power-of-two number $2^N$, but less than $2^{N+1}$, 302. Generally, the system is configured to operate with a the particular value P for the coding operations, and $2^N$ is typically given for the system (e.g., $2^N=256$ is convenient for an 8-bit system). A data interface (e.g., 112 of FIG. 1) receives a sequence (e.g., 102 of FIG. 1, 210 of FIG. 2) to encode, and passes it to a coder (e.g., 110 of FIG. 1, 220 of FIG. 2), 304. The coder identifies the next element of the sequence to encode, 306.

For each element, the coder determines if the value of the element is within the range 0:(P−M−1) (or 0 through (P−M−1)) or M:(P−1), 308. Such a determination can be made through a simple logic test as is understood by those skilled in the art. If the value of the element is within the range 0:(P−M−1) or M:(P−1), the value is not within an N-bit representation range, 310, and the coder represents the value with N+1 bits. If the value of the element is within the range (P−M):(M−1), the value is within an N-bit representation range, 310, and the coder represents the value with N bits, as continued at 318.

In one embodiment, the (N+1)-bit representation may not be a (N+1)-bit face-value representation of the value, but rather an N-bit representation of the value with an additional disambiguation bit. In such an implementation, if the value is not within the N-bit range, the coder may perform a modulo operation to obtain a representation of the value within an N-bit range, 312. In conjunction with the modulo operation, or complementary to the modulo operation, the coder may also determine whether the value is M or greater, or less than M, to determine what disambiguation bit to use. The coder can then generate the disambiguation bit, 314.

The coder generates a sequence of codes, with disambiguation information. The coder uses a particular disambiguation information convention, and inserts the disambiguation information in accordance with the disambiguation convention, 316. The disambiguation convention may be to place a bit directly before or after the element to disambiguate, or to include a disambiguation value in the sequence. Inserting the disambiguation information may further include generating a header or similar indicator information to identify the disambiguation convention to a receiving (decoding) device.

The coder may then encode the element with an N-bit representation, 318. It will be understood that generating disambiguation information can be performed before, after, or in parallel or substantially simultaneously with generating the N-bit representation. The encoded element is added to the encoded sequence, 320. If a multi-bit disambiguation value is used, the disambiguation information may not be added until the encoded sequence is generated, or at least a portion of the encoded sequence having the number of elements represented in the disambiguation information. If the element processed is the last element, 322, the encoding is done. Otherwise, the coder identifies the next element to be encoded, and repeats what is described above, starting at 306.

Figure 4:
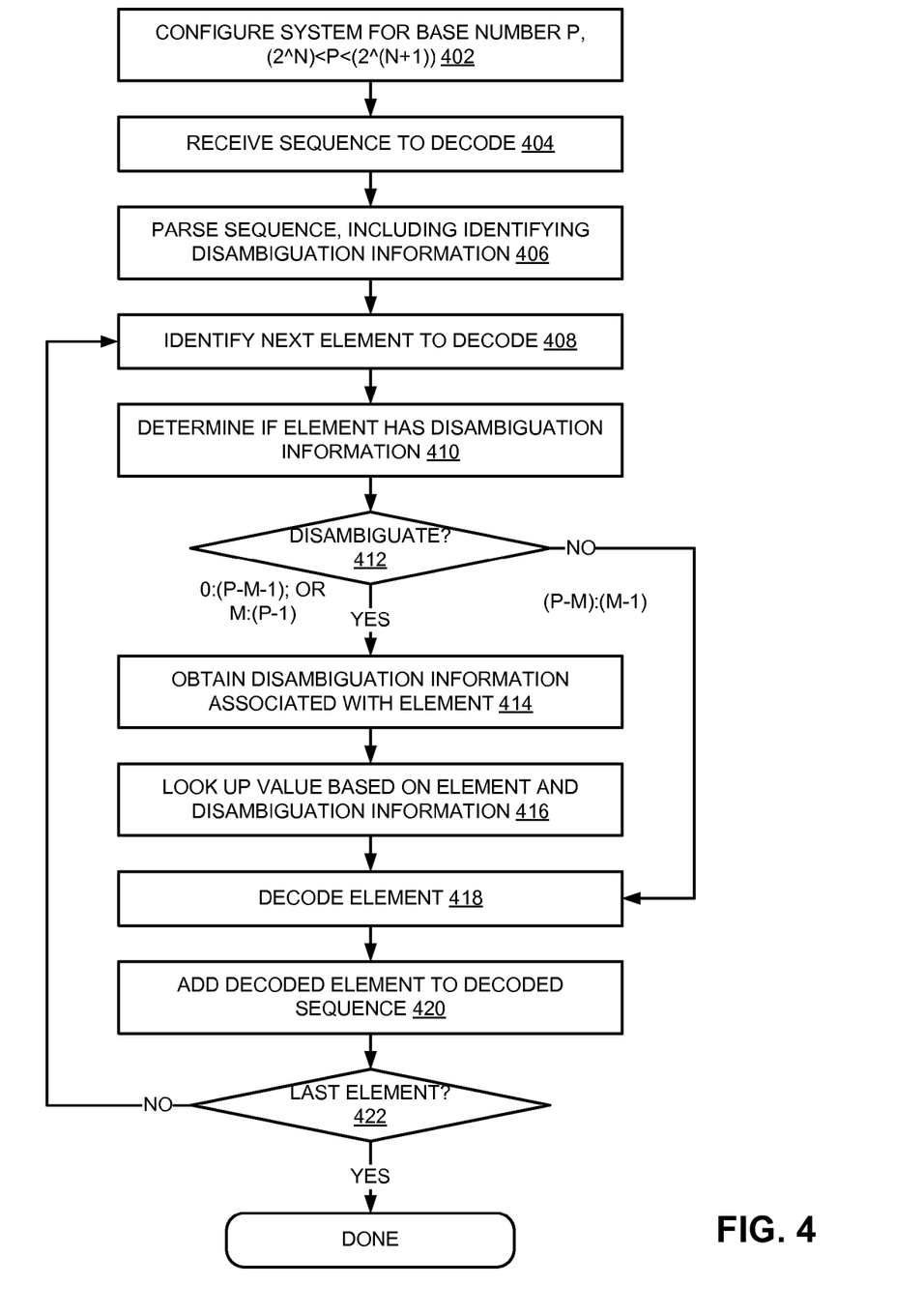
FIG. 4 is a flow diagram of an embodiment of a method for decoding a sequence of efficiently encoded elements.

FIG. 4 is a flow diagram of an embodiment of a method for decoding a sequence of efficiently encoded elements. The method or process may be performed by processing logic that may include hardware (e.g., circuitry, programmable logic, microcode, etc.), software (such as instructions run on a processing device), or a combination thereof. For convenience, reference is made to components that might perform one or more of the operations described below. Reference to particular components may not necessarily be exclusive, and other components not specifically called out may perform one or more of the following operations.

A system (e.g., system 100 of FIG. 1) is configured for a base of P, which is greater than a power-of-two number $2^N$, but less than $2^{N+1}$, 402. Generally, the system is configured to operate with a the particular value P for the coding operations, and $2^N$ is typically given for the system (e.g., $2^N=65536$ is convenient for a 16-bit system). A data interface (e.g., 112 of FIG. 1) receives a sequence (e.g., 102 of FIG. 1, 210 of FIG. 2) to decode, and passes it to a coder (e.g., 110 of FIG. 1, 220 of FIG. 2), 404. The coder may parse the sequence, including identifying disambiguation information, 406. The disambiguation information may be identified by a disambiguation or sequence structure identifier sent by the encoder. The coder identifies the next element of the sequence to decode, 408.

For each element, the coder determines if the element has disambiguation information associated with it, 410. If the value of the element is within the range 0:(P−M−1) or M:(P−1), it will have disambiguation information, and the coder needs to disambiguate the code, 412. Elements with values within that range are not represented with N bits, but (N+1) bits. If the value of the element is within the range (P−M):(M−1), the value is within an N-bit representation range, and the coder does not need to disambiguate the element, 412. The coder can continue decoding at 418 for N-bit values.

For values to be disambiguated, the decoder obtains the disambiguation information associated with the element, 414, either parsing and obtaining a value to disambiguate multiple elements, or otherwise obtaining a bit from the sequence for a single element. In one embodiment, the decoder looks up the value of the element based on the N-bit value representation and the additional disambiguation bit, 416. For both disambiguated and non-disambiguated elements, the decoder decodes the element, 418.

The decoder generates a sequence of values from the processed or decoded elements. The current decoded element is added to a decoded sequence, 420. If the element processed is the last element, 422, the decoding is done. Otherwise, the decoder identifies the next element to be decoded, and repeats what is described above, starting at 408.

Figure 5:
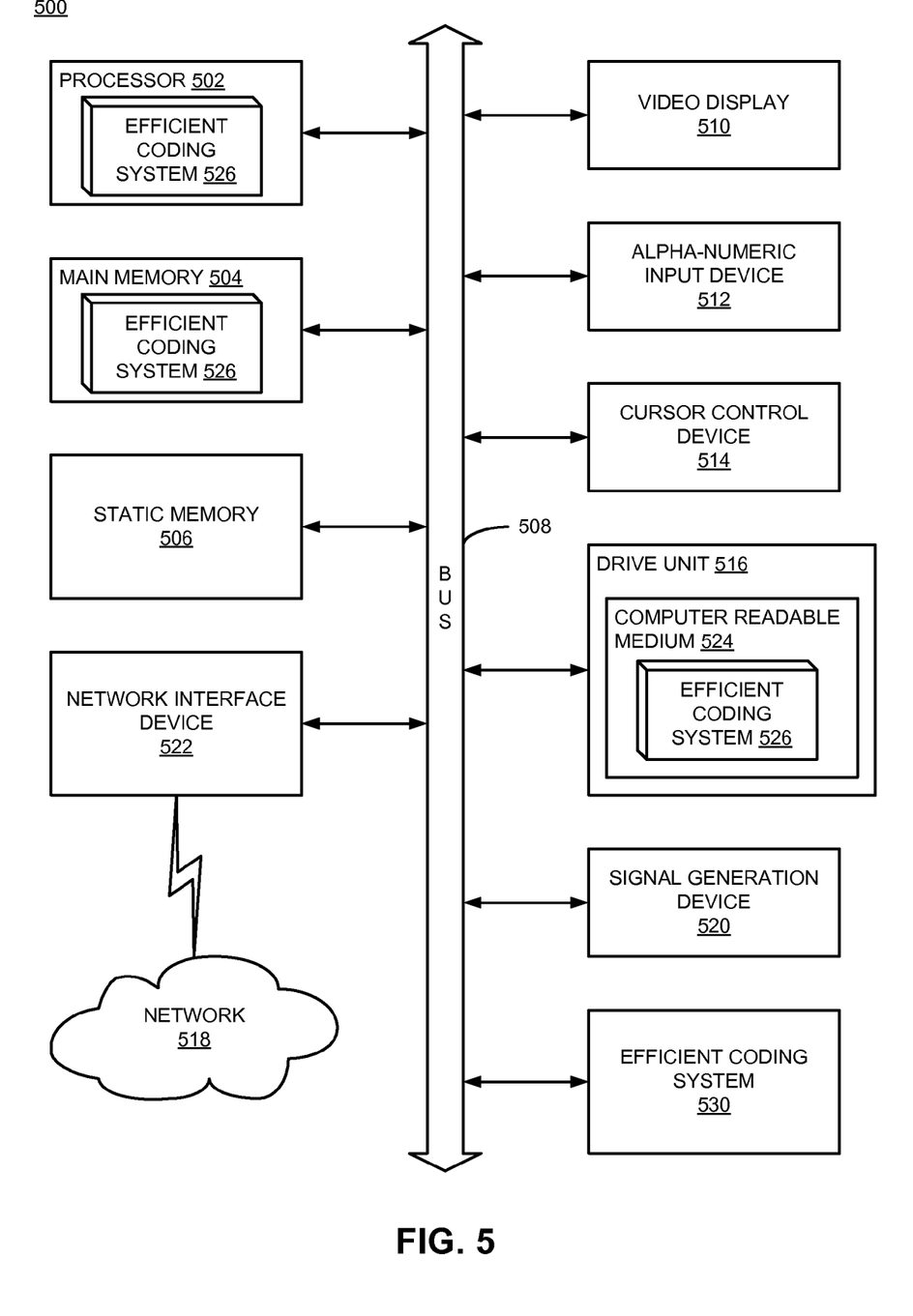
FIG. 5 is a block diagram of a computing device on which embodiments of the invention may be implemented.

FIG. 5 illustrates a diagrammatic representation of a machine in the exemplary form of a computer system 500 within which a set of instructions, for causing the machine to perform any one or more of the methodologies discussed herein, may be executed. Within the computer system 500 is a set of instructions for causing the machine to perform any one or more of the methodologies discussed herein. In alternative embodiments, the machine may be connected (e.g., networked) to other machines in a LAN, an intranet, an extranet, or the Internet. The machine can operate in the capacity of a server or a client machine (e.g., a client computer executing the browser and the server computer executing the automated task delegation and project management) in a client-server network environment, or as a peer machine in a peer-to-peer (or distributed) network environment. The machine may be a personal computer (PC), a tablet PC, a console device or set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processing device 502, a main memory 504 (e.g., read-only memory (ROM), flash memory, dynamic random access memory (DRAM) such as synchronous DRAM (SDRAM), etc.), a static memory 506 (e.g., flash memory, static random access memory (SRAM), etc.), and a secondary memory 516 (e.g., a data storage device in the form of a drive unit, which may include fixed or removable computer-readable storage medium), which communicate with each other via a bus 508.

Processing device 502 represents one or more general-purpose processing devices such as a microprocessor, central processing unit, or the like. More particularly, the processing device 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. Processing device 502 is configured to execute the efficient coding system 526 for performing the operations and steps discussed herein.

The computer system 500 may further include a network interface device 522. The computer system 500 also may include a video display unit 510 (e.g., a liquid crystal display (LCD) or a cathode ray tube (CRT)) connected to the computer system through a graphics port and graphics chipset, an alphanumeric input device 512 (e.g., a keyboard), a cursor control device 514 (e.g., a mouse), and a signal generation device 520 (e.g., a speaker).

The secondary memory 516 may include a machine-readable storage medium (or more specifically a computer-readable storage medium) 524 on which is stored one or more sets of instructions (e.g., the efficient coding system 526) embodying any one or more of the methodologies or functions described herein. The efficient coding system 526 may also reside, completely or at least partially, within the main memory 504 and/or within the processing device 502 during execution thereof by the computer system 500, the main memory 504 and the processing device 502 also constituting machine-readable storage media. The efficient coding system 526 may further be transmitted or received over a network 518 via the network interface device 522.

The computer-readable storage medium 524 may also be used to store the efficient coding system 526 persistently. While the computer-readable storage medium 524 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media.

In one embodiment, one or more modules 530 implement the efficient coding described herein, and modules 530, components, and other features described herein (for example in relation to FIG. 1) can be implemented as discrete hardware components or integrated in the functionality of hardware components such as ASICS, FPGAs, DSPs or similar devices. In addition, modules 530 can be implemented as firmware or functional circuitry within hardware devices. Further, modules 530 can be implemented in any combination hardware devices and software components.

In the above description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "matching," "prompting," "selecting," "sending," "generating," "displaying" or the like, refer to the actions and processes of a computer system, or similar electronic computing device that manipulates and transforms data represented as physical (electronic) quantities within the computer system's registers and memories into other data similarly represented as physical quantities within the computer system memories, registers or other such information storage, transmission or display devices.

The present invention also relates to an apparatus for performing the operations herein. This apparatus may be specially constructed for the required purposes or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, Flash memory devices including universal serial bus (USB) storage devices (e.g., USB key devices) or any type of media suitable for storing electronic instructions, each of which may be coupled to a computer system bus.

The algorithms and displays presented herein are not inherently related to any particular computer or other apparatus. Various general purpose systems may be used with programs in accordance with the teachings herein or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A computer-readable storage medium includes any mechanism for storing information in a form readable by a computer. For example, a computer-readable storage medium includes read only memory ("ROM"), random access memory ("RAM"), magnetic disk storage media; optical storage media, flash memory devices or other type of machine-accessible storage media.

Various operations or functions are described herein, which may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communication interface to send data via the communication interface. A machine or computer readable storage medium may cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A computer-implemented method comprising:
   receiving a sequence of elements to code, each element having a numeric integer value within the range 0 through (P−1), where P is a number greater than M, where M is a power-of-two number $2^N$, where N is an integer greater than zero;
   coding with a coding processor elements in the sequence to an N-bit representation for all elements in the sequence having a value within the range of integers (P−M) through (M−1);
   coding with the coding processor elements in the sequence to an (N+1)-bit representation for all elements in the sequence having a value within the ranges of integers 0 through (P−M−1) and M through (P−1); and
   generating a sequence of coded values to represent a data signal from the coded elements.

2. The method of claim 1, wherein P is a prime number equal to $2^N+1$.

3. The method of claim 1, wherein P is prime.

4. The method of claim 1, wherein coding elements to an (N+1)-bit representation comprises:
   computing a result of the value of each element modulo N;
   representing the result with an N-bit representation equal to a numeric value of the result; and
   inserting a disambiguation bit for each element.

5. The method of claim 4, wherein including the disambiguation bit comprises:
   inserting the disambiguation bit directly before or after the N-bit representation equal to the value modulo N.

6. The method of claim 4, wherein inserting the disambiguation bit comprises:
   inserting a disambiguation value having a number of bits corresponding to a group of coded elements in the sequence.

7. The method of claim 6, wherein the disambiguation value has N bits corresponding to N disambiguation bits for N elements in the sequence coded with a disambiguation bit.

8. The method of claim 1, wherein generating the sequence of coded values comprises:
   generating a coded sequence for an implementation of a cryptographic system.

9. The method of claim 1, wherein generating the sequence of coded values comprises:
   generating a coded sequence compatible with a Reed-Solomon-based coding implementation.

10. A computer-readable storage medium having instructions stored thereon, which when executed, cause a processor to perform operations including:
    receiving a sequence of elements to code, each element having a numeric integer value within the range 0 through (P−1), where P is a number greater than M, where M is a power-of-two number $2^N$, where N is an integer greater than zero;
    coding with a coding processor elements in the sequence to an N-bit representation for all elements in the sequence having a value within the range of integers (P−M) through (M−1);
    coding with the coding processor elements in the sequence to an (N+1)-bit representation for all elements in the sequence having a value within the ranges of integers 0 through (P−M−1) and M through (P−1); and
    generating a sequence of coded values to represent a data signal from the coded elements.

11. The computer readable medium of claim 10, wherein P is 257 or 65537.

12. The computer readable medium of claim 10, wherein the instructions for coding elements to an (N+1)-bit representation comprise instructions for
    computing a result of the value of each element modulo N;
    representing the result with an N-bit representation equal to a numeric value of the result; and
    inserting a disambiguation bit for each element.

13. The computer readable medium of claim 12, wherein the instructions for including the disambiguation bit comprise instructions for
    inserting the disambiguation bit directly before or after the N-bit representation equal to the value modulo N.

14. The computer readable medium of claim 12, wherein the instructions for inserting the disambiguation bit comprise instructions for
    inserting a disambiguation value having a number of bits corresponding to a group of coded elements in the sequence.

15. The computer readable medium of claim 14, wherein the disambiguation value has N bits corresponding to N disambiguation bits for N elements in the sequence coded with a disambiguation bit.

16. A computing device comprising:
- a data interface to receive a sequence of elements to code, each element having a numeric integer value within the range 0 through (P−1), where P is a number greater than M, where M is a power-of-two number $2^N$, where N is an integer greater than zero; and
- a coder coupled to the data interface to code the sequence of elements, the coder to
    - generate an N-bit representation for all elements in the sequence having a value within the range of integers (P−M) through (M−1);
    - generate an (N+1)-bit representation for all elements in the sequence having a value within the ranges of integers 0 through (P−M−1) and M through (P−1); and
    - generate a processed sequence from the elements to represent the coded received sequence of elements.

17. The computing device of claim 16, wherein the coder further comprises:
- a modulo generator to compute a result of the value of each element modulo N;
- wherein the coder represents the result with an N-bit representation equal to a numeric value of the result, and inserts a disambiguation bit for each element.

18. The computing device of claim 17, wherein the coder further comprises:
- a disambiguation module to insert the disambiguation bit directly before or after the N-bit representation equal to the value modulo N.

19. The computing device of claim 17, wherein the coder further comprises:
- a disambiguation module to insert a disambiguation value having a number of bits corresponding to a group of coded elements in the sequence.

20. The computing device of claim 19, wherein the disambiguation value has N bits corresponding to N disambiguation bits for N elements in the sequence coded with a disambiguation bit.

* * * * *